US008168969B2

United States Patent
Sung

(10) Patent No.: US 8,168,969 B2
(45) Date of Patent: *May 1, 2012

(54) SEMICONDUCTOR-ON-DIAMOND DEVICES AND METHODS OF FORMING

(75) Inventor: Chien-Min Sung, Tansui (TW)

(73) Assignee: RiteDia Corporation, Hsin Chu Industrial Park (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/983,801

(22) Filed: Jan. 3, 2011

(65) Prior Publication Data

US 2011/0163312 A1 Jul. 7, 2011

Related U.S. Application Data

(60) Continuation of application No. 11/876,326, filed on Oct. 22, 2007, now Pat. No. 7,863,606, which is a continuation of application No. 11/323,187, filed on Dec. 29, 2005, now Pat. No. 7,812,395, which is a division of application No. 10/846,847, filed on May 13, 2004, now Pat. No. 7,132,309, which is a continuation-in-part of application No. 10/421,369, filed on Apr. 22, 2003, now Pat. No. 7,011,134, which is a continuation-in-part of application No. 10/002,395, filed on Oct. 19, 2001, now Pat. No. 6,814,130, which is a continuation-in-part of application No. 09/687,444, filed on Oct. 13, 2000, now Pat. No. 6,659,161.

(51) Int. Cl.
   *H01L 29/22* (2006.01)
(52) U.S. Cl. .................... 257/43; 257/77; 257/E29.094; 438/105
(58) Field of Classification Search .................. 257/43, 257/77, E29.094, E29.082, E21.049; 438/105
See application file for complete search history.

(56) References Cited

U.S. PATENT DOCUMENTS 7,863,606 B2 * 1/2011 Sung .............................. 257/43
* cited by examiner

*Primary Examiner* — Roy Potter
(74) *Attorney, Agent, or Firm* — Thorpe North & Western LLP

(57) ABSTRACT

The present invention provides semiconductor-on-diamond devices, and methods for the formation thereof. In one aspect, a mold is provided which has an interface surface configured to inversely match a configuration intended for the device surface of a diamond layer. An adynamic diamond layer is then deposited upon the diamond interface surface of the mold, and a substrate is joined to the growth surface of the adynamic diamond layer. At least a portion of the mold can then be removed to expose the device surface of the diamond which has received a shape which inversely corresponds to the configuration of the mold's diamond interface surface. The mold can be formed of a suitable semiconductor material which is thinned to produce a final device. Optionally, a semiconductor material can be coupled to the diamond layer subsequent to removal of the mold.

22 Claims, 3 Drawing Sheets

SEMICONDUCTOR-ON-DIAMOND DEVICES AND METHODS OF FORMING

RELATED APPLICATIONS

This application is a continuation of U.S. patent application Ser. No. 11/876,326, filed on Oct. 22, 2007 now U.S. Pat. No. 7,863,606, which is a continuation of U.S. patent application Ser. No. 11/323,187, filed Dec. 29, 2005 now U.S. Pat. No. 7,812,395, now published as United States Publication No. 2006/0186556, which is a divisional of U.S. patent application Ser. No. 10/846,847, filed May 13, 2004, now issued as U.S. Pat. No. 7,132,309, which is a continuation-in-part of U.S. patent application Ser. No. 10/421,369, filed on Apr. 22, 2003, now issued as U.S. Pat. No. 7,011,134, which is a continuation-in-part of U.S. patent application Ser. No. 10/002,395, filed on Oct. 19, 2001, now issued as U.S. Pat. No. 6,814,130, which is a continuation-in-part of U.S. patent application Ser. No. 09/687,444, filed on Oct. 13, 2000, now issued as U.S. Pat. No. 6,659,161, each of which are incorporated herein by reference in their entireties.

FIELD OF THE INVENTION

The present invention relates to semiconductor devices incorporating super-hard materials, such as diamond or diamond-like substances, and methods for making such devices. More particularly, the present invention relates to the use of vapor deposition for making semiconductor devices incorporating diamond materials.

BACKGROUND OF THE INVENTION

Diamond and diamond-like substances have many properties, such as wear resistance, thermal conductivity, electrical resistivity, acoustic transmission, and corrosion inertness, which make them desirable for a variety of industrial applications. To this end, diamond and diamond-like substances have been incorporated into tools for various purposes such as saw blades, drill bits, and electronic components such as surface acoustic wave filters. Methods for incorporating diamond or diamond-like materials into a tool can include known processes such as chemical vapor deposition (CVD) and physical vapor deposition (PVD).

Various CVD techniques have been used in connection with depositing diamond or diamond-like materials onto a substrate. Typical CVD techniques use gas reactants to deposit the diamond or diamond-like material in a layer, or film. These gases generally include a small amount (i.e. less than about 5%) of a carbonaceous material, such as methane, diluted in hydrogen. A variety of specific CVD processes, including equipment and conditions, are well known to those skilled in the art.

In forming a layer of diamond, or diamond-like material on a substrate using CVD techniques, a plurality of diamond grains, or "seeds," may be first placed upon the substrate surface. The placement of such seeds may be accomplished using CVD itself such as by applying a voltage bias, by polishing with micron-sized diamond, or by other methods known in the art. These seeds act as diamond nuclei and facilitate the growth of a diamond layer outwardly from the substrate as carbon vapor is deposited thereon. As a result, the growing side of the diamond layer becomes increasingly coarse in grain size, and must ultimately be ground and polished to a smooth finish such as by a mechanical means, in order to be suitable for many industrial applications. However, as diamond and diamond-like substances are among the hardest known materials, such mechanical grinding and polishing is difficult and tedious. Moreover, the cost of polishing often exceeds the cost for making the diamond film itself. In addition, mechanical polishing inevitably introduces microcracks or variations on the diamond surface. Such cracks and variations are detrimental to certain applications.

The semiconductor industry has recently expanded efforts in producing semiconductor-on-insulator (SOI) devices. These devices allow for electrical insulation between an underlying substrate and any number of useful semiconductor devices. Typically, these SOI devices can include insulating layers with poor thermal conductivity, high degree of thermal expansion mismatch, and/or difficulties in epitaxial growth of silicon or other semiconductor materials. In light of some of these difficulties, various efforts have explored using diamond as the insulating layer with some success. However, such devices continue to benefit from further improvement such as decreasing manufacturing costs, improving performance, and the like.

As such, SOI devices and methods for making diamond containing SOI devices which have improved performance and reduced production costs continues to be sought.

SUMMARY OF THE INVENTION

Accordingly, the present invention provides semiconductor-on-diamond (SOD) devices and methods for making such devices that address many of the difficulties mentioned above. As such, the present devices and methods are capable of providing SOD devices with improved insulating properties and which are particularly suitable for use in insulating semiconductor devices and the like.

In one aspect of the present invention, a SOD device can include a substrate having an adynamic diamond layer on the substrate. A device surface of the adynamic layer can be to oriented distal to the substrate. Further, a semiconductor layer can be coupled to the device surface of the diamond layer. The semiconductor layer can be formed directly on the intermediate layer or formed on an intermediate layer.

In an additional aspect, the semiconductor layer can be coupled using an intermediate layer such as aluminum nitride, chromium nitride, silicon, silicon carbide, silicon nitride, tungsten carbide, gallium nitride, diamond-like carbon, and composites thereof.

In one detailed aspect, the device surface can have a surface roughness (Ra) from about 1 nm to about 1 μm.

As a general matter, the method of making an SOD device in accordance with the present invention begins by providing a mold having an interface surface configured to inversely match a configuration intended for a device surface of the diamond SOD device. An adynamic diamond layer can then be grown on the diamond interface surface of the mold using a vapor deposition technique. As diamond growth proceeds, the adynamic diamond layer receives a growth surface opposite the device surface, which is then joined to a substrate or support layer. A semiconductor layer can also be coupled to the device surface.

In one embodiment, at least a portion of the mold can be removed. In some cases, the mold can be thinned to form either the semiconductor layer and/or the intermediate layer. Thus, the mold can be chosen of a material suitable for incorporation into the final SOD device. Alternatively, the mold can be completely removed and a semiconductor layer, and optional intermediate layer, formed on the exposed diamond device surface.

In still another alternative aspect, a method of making a SOD device can include providing a mold having an interface surface. An adynamic diamond layer can be grown on the interface surface using a vapor deposition technique, said adynamic diamond layer having a growth surface opposite the interface surface. A semiconductor layer can also be coupled to the growth surface of the adynamic diamond layer.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

Figure 1:
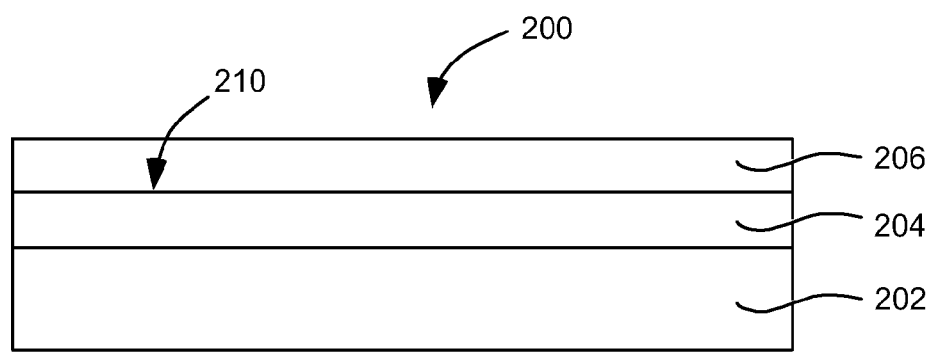
FIG. 1 is a side cross-sectional view of an SOD device in accordance with an embodiment of the present invention.

The above figures are provided for illustrative purposes only. It should be noted that actual dimensions of layers and features may differ from those shown.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," and, "the" include plural referents unless the context clearly dictates otherwise. Thus, for example, reference to "an intermediate layer" includes one or more of such layers, reference to "a carbon source" includes reference to one or more of such carbon sources, and reference to "a CVD technique" includes reference to one or more of such CVD techniques.

DEFINITIONS

In describing and claiming the present invention, the following terminology will be used in accordance with the definitions set forth below.

As used herein, "super hard" and "superabrasive" may be used interchangeably, and refer to any crystalline, or polycrystalline material, or mixture of such materials which has a Moh's hardness of about 8 or greater. In some aspects, the Moh's hardness may be about 9.5 or greater. Such materials include but are not limited to diamond, polycrystalline diamond (PCD), cubic boron nitride, polycrystalline cubic boron nitride (PCBN) as well as other super hard materials known to those skilled in the art. Super hard materials may be incorporated into the present invention in a variety of forms including particles, grits, films, layers, etc.

As used herein, "substrate" refers to a non-diamond surface, to which various materials can be joined in forming an SOD device. The substrate may be any shape, thickness, or material, required in order to achieve a specific result, and includes but is not limited to metals, alloys, ceramics, and mixtures thereof. Further, in some aspects, the substrate, may be an existing semiconductor device or wafer, or may be a material which is capable of being joined to a suitable device. In some additional aspects, the substrate can be a material that once bonded to an adynamic diamond layer, has sufficient integrity to prevent the layer from changing shape once separated from the mold upon which it was made.

As used herein, "metallic" refers to any type of material or compound wherein the majority portion of the material is a metal. As such, various oxide, nitride, and carbide compounds, as well as any other material or compound, containing a greater non-metal portion than metal portion are not considered to be "non-metallic." Examples of various metals considered to be particularly useful in the practice of the present invention include, without limitation: aluminum, tungsten, molybdenum, tantalum, zirconium, vanadium, chromium, copper, and alloys thereof.

As used herein, "ceramic" refers to a non-diamond, non-metallic, material, which is hard, heat resistant, corrosion resistant, and can be polished to have a surface roughness (Ra) of less than about 1 micrometer. Further, as used herein, "ceramic" materials may contain at least one element selected from the group consisting of: Al, Si, Li, Zn, and Ga. Oxides, nitrides, and various other compounds which include the above recited elements are well known as ceramics to those skilled in the art. Additional materials considered to be "ceramics" as used herein, such as glass, are known to those skilled in the art. Examples of specific ceramics useful in the present invention include without limitation, Si, $SiO_2$, $Si_3N_4$, $Al_2O_3$, AlN, BN, TIN, ZrN, GaAs, GaP, $LiTaO_3$, $LiNbO_3$, ZnO, glass, such as soda glass, etc.

As used herein, "interface surface" refers to the surface of a mold, or ephemeral mold, or other layer of material conveying the shape of the mold, upon which materials used in the fabrication of a diamond layer or film are deposited. Such materials include diamond or other superabrasive particles, as well as peripheral materials used to facilitate diamond layer growth using a CVD technique, such as diamond nucleation enhancers. The interface surface can be the immediate surface of the mold or may include an exposed surface resulting from a thin layer of material formed thereon which does not significantly affect the surface contours and roughness of the original mold surface, and thus conveys the configuration thereof. Such thin layers can include nucleation enhancing materials, piezoelectric materials, and any other material which can be formed in sufficiently thin layers so as to retain a substantially identical surface as the original smooth mold surface.

As used herein with respect to a mold, "outside surface" refers to a surface of the mold which is not in direct contact with the diamond layer.

As used herein, "adynamic" refers to a type of layer which is unable to independently retain its shape and/or strength. For example, in the absence of a mold or support layer, an adynamic diamond layer will tend to curl or otherwise deform when the mold or support surface is removed. While a number of reasons may contribute to the adynamic properties of a layer, in one aspect, the reason can be the extreme thinness of the layer.

As used herein, "nucleation enhancer" refers to a material, which increases the quality of a diamond layer formed from a plurality of diamond nuclei using a CVD process. In one aspect, the nucleation enhancer may increase the quality of the diamond layer by reducing movement or, or immobilizing diamond nuclei. Examples of nucleation enhancers include without limitation, metals, and various metallic compounds, as well as carbides and carbide forming materials.

As used herein with respect to a nucleation enhancer layer and an intermediate layer, "thin" refers to the thickness or depth of the layer being sufficiently small so as to not substantially interfere with the transfer of the intended configuration from the interface surface configuration to the device surface. In one aspect, the thickness of the nucleation enhancer may be less than about 0.1 micrometers. In another aspect, the thickness may be less than 10 nanometers. In another aspect, the thickness may be less than about 5 nanometers.

As used herein, "device surface" refers to the surface of a diamond layer which contacts a semiconductor or other electronic device.

As used herein, "diamond layer" refers to any structure, regardless of shape, which contains diamond-containing materials which can be incorporated into a SOD device. Thus, for example, a diamond film partially or entirely covering a surface is included within the meaning of these terms. Additionally, a layer of a material, such as metals, acrylics, or composites, having diamond particles disbursed therein is included in these terms.

As used herein, "diamond-containing materials" refer to any of a number of materials which include carbon atoms bonded with at least a portion of the carbons bonded in at least some $sp^3$ bonding. Diamond-containing materials can include, but are not limited to, natural or synthetic diamond, polycrystalline diamond, diamond-like carbon, amorphous diamond, and the like. Most often, the diamond layers of the present invention are formed as diamond-like carbon and/or amorphous diamond.

As used herein, "vapor deposited" refers to materials which are formed using vapor deposition techniques.

As used herein, "vapor deposition" refers to a process of depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), metal-organic CVD (MOCVD), sputtering, thermal evaporation PVD, ionized metal PVD (IMPVD), electron beam PVD (EBPVD), reactive PVD, and the like.

As used herein, "chemical vapor deposition," or "CVD" refers to any method of chemically depositing diamond or other particles in a vapor form upon a surface. Various CVD techniques are well known in the art.

As used herein, "CVD passive material" refers to a material which does not allow substantial deposition of diamond or other materials using CVD methods directly to the material. One example of a CVD passive material with respect to deposition of diamond is copper. As such, during CVD processes carbon will not deposit on the copper but only on CVD active materials such as silicon, diamond, or other known materials. Thus, CVD passive materials can be "passive" with respect to some materials and not others. For example, a number of carbide formers can be successfully deposited onto copper.

As used herein, "inversely correspond" refers to the inverse relationship between the configuration of a diamond device surface, and the configuration of a mold's interface surface from which the device surface was made, when such surfaces are oriented in the same direction. In other words, when a device surface is formed at the interface surface of a mold, the configuration of each will inversely correspond to the other when the surfaces are separated and faced in the same direction. In some instances, the inverse correspondence may result in a mirror image.

As used herein, "nucleation side," "nucleation surface," and similar terms may be used interchangeably, and refer to the side or surface of a diamond layer at which nucleation of diamond particles originated. Otherwise described, the nucleation surface of a diamond layer is the side or surface, which was first deposited upon the interface surface of a mold. In many instances, the nucleation surface may become the device surface of the tool.

As used herein, "growth side," "grown side," and "grown surface" may be used interchangeably and refer to the surface of a superabrasive film or layer which is grows during a CVD process.

As used herein, "Ra" refers to a measure of the roughness of a surface as determined by the difference in height between a peak and a neighboring valley. Further, "Rmax" is a measure of surface roughness as determined by the difference in height between the highest peak on the surface and the lowest valley on the surface.

As used herein with respect to an identified property or circumstance, "substantially" refers to a degree of deviation that is sufficiently small so as to not measurably detract from the identified property or circumstance. The exact degree of deviation allowable may in some cases depend on the specific context. Thus, for example, a source material which has a composition "substantially" that of a particular region may deviate in composition or relevant property by experimental error up to several percent, e.g., 1% to 3%.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

As an illustration, a numerical range of "about 1 micrometer to about 5 micrometers" should be interpreted to include not only the explicitly recited values of about 1 micrometer to about 5 micrometers, but also include individual values and sub-ranges within the indicated range. Thus, included in this numerical range are individual values such as 2, 3, and 4 and sub-ranges such as from 1-3, from 2-4, and from 3-5, etc.

This same principle applies to ranges reciting only one numerical value. For example, a range recited as "less than about 5 micrometers" should be interpreted to include all values and sub-ranges between 5 micrometers and 0 micrometers, including the value of 0 micrometers. Furthermore, such an interpretation should apply regardless of the breadth of the range or the characteristics being described.

The Invention

Referring now to FIG. 1, a semiconductor-on-insulator (SOI) device is shown generally at 200 in accordance with one embodiment of the present invention. A substrate 202 can be included to provide support and/or functional properties to the SOI device. Any number of materials can be used as a substrate material. Typically, the substrate can be formed of a material having desirable properties for a particular application. For example, in some embodiments, mechanical strength, thermal expansion, thermal conductivity, electrical resistivity, and the like can be important. Several non-limiting examples of suitable substrate materials include tungsten, silicon, silicon carbide, silicon nitride, titanium carbide, titanium nitride, boron nitride, graphite, other ceramics, glass, molybdenum, zirconium, tantalum, chromium, aluminum nitride, DLC, and composites thereof. A substrate comprising tungsten can provide exceptional mechanical support as well as low thermal expansion. Similarly, a substrate comprising silicon can be highly compatible with incorporation into various semiconductor devices and/or products. Although many materials can act as a suitable substrate, materials having a low thermal coefficient of expansion are preferred. This is at least partially in consideration of reducing thermal expansion stresses at the interface between the substrate and an adjacent material, e.g. DLC, silicon, gallium nitride, gallium arsenide, etc.

An adynamic diamond layer 204 can also be on the substrate 202. The adynamic diamond layer can have a device surface 210 distal to the substrate. The adynamic diamond layer can comprise a diamond-containing material. Typically, the adynamic layer is grown using a vapor deposition method, as discussed below in connection with the methods of the present invention. The adynamic diamond layer can have a number of special properties which are advantageous for use in SOD devices. Generally, the diamond layer can have a thickness from about 10 nm to about 100 μm, and in some cases about 100 nm to about 30 μm. Further, the diamond layer thicknesses of less than about 10 μm can be suitable for some applications. In one specific embodiment, the diamond layer can have a thickness from about 10 nm to less than 100 μm. Frequently, an adynamic diamond layer having a thickness of less than about 30 μm can provide desired insulating affects, while also minimizing production time and costs.

An additional consideration includes the surface roughness of the device surface 210. More specifically, a very smooth device surface can have a number of desirable effects. Some of these considerations include: adherence of semiconductor layers thereto, improved resolution of feature formation, improved coupling coefficients, and the like. For example, the methods and devices described herein focus primarily on SOD devices, exclusive of any features or semiconductor devices which can be formed thereon, subsequent to, or in combination with, the methods described herein. During fabrication of various devices, the focal depth of a light source can influence the resolution and minimum feature size, e.g., line width, etc., achievable using specific equipment. Focal depth refers to the depth for which an image is in focus on the surface of a wafer or other substrate. Thus, at differing depths, an exposed image can have a deteriorating focus or line edge acuity. Typical focal depths are in the range of 1 μm to 2 μm, although ranges outside this are known. In addition, a rough surface can interfere with this resolution, especially as the degree of surface roughness approaches the focal depth of the particular equipment used. Therefore, as surface roughness of an exposed surface is reduced, an increase in resolution and device densities can be achieved. In other words, in some cases, the surface roughness can be a limiting factor for device resolutions and densities.

In accordance with the present invention, surface roughness can be significantly reduced without polishing expensive layers of diamond or silicon. This aspect will be discussed in more detail below in connection with certain methods. As a result, the primary limitation to achievable resolutions can then be the equipment used instead of the wafer or materials exposed. As an example, the device surface 210 can have a surface roughness (Ra) from about 1 nm to about 1 μm, and preferably from about 1 nm to about 20 nm, and most preferably from about 1 nm to about 10 nm.

A semiconductor layer 206 can be coupled to the device surface 210 of the diamond layer 204. The semiconductor layer can be directly coupled to the device surface or can be coupled via an additional layer. The semiconductor layer can comprise any material which is suitable for forming electronic devices, semiconductor devices, or the like. Most semiconductors are based on silicon, gallium, indium, and germanium. However, suitable materials for the semiconductor layer can include, without limitation, silicon, silicon carbide, gallium arsenide, gallium nitride, germanium, zinc sulfide, gallium phosphide, gallium antimonide, gallium indium arsenide phosphide, aluminum gallium arsenide, gallium nitride, boron nitride, aluminum nitride, indium arsenide, indium phosphide, indium antimonide, indium nitride, and composites thereof. In one embodiment, the semiconductor layer can comprise silicon, silicon carbide, gallium arsenide, gallium nitride, aluminum nitride, or composites of these materials. In some additional embodiments, non-silicon based devices can be formed such as those based on gallium arsenide, gallium nitride, germanium, boron nitride, aluminum nitride, indium-based materials, and composites thereof. Other semiconductor materials which can be used include $Al_2O_3$, BeO, W, Mo, c-$Y_2O_3$, c-$(Y_{0.9}La_{0.1})_2O_3$, c-$Al_{23}O_{27}N_5$, c-$MgAl_2O_4$, t-$MgF_2$, graphite, and mixtures thereof. However, currently, most semiconductor devices are silicon based.

Figure 2:
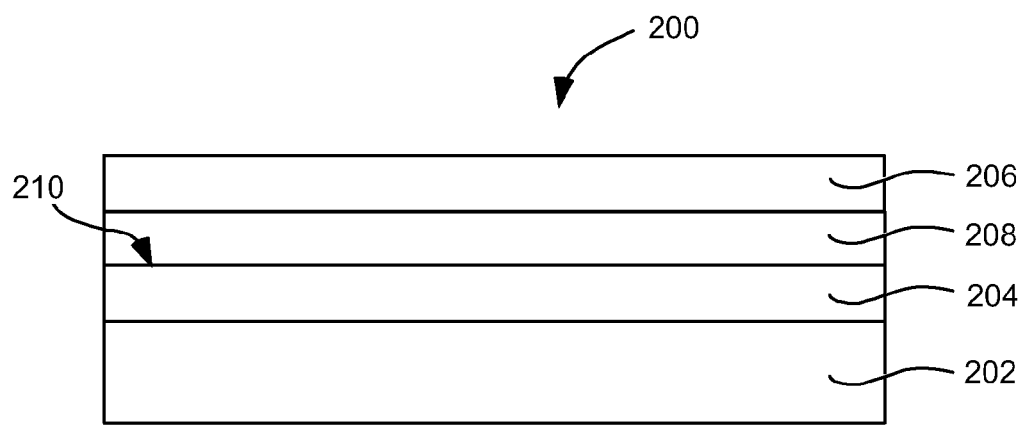
FIG. 2 is a side cross-sectional view of an SOD device in accordance with an alternative embodiment of the present invention.

Referring now to FIG. 2, the semiconductor layer 206 can be coupled to the device surface 210 using an intermediate layer 208. The intermediate layer can provide a number of benefits, such as, but not limited to, improved thermal expansion matching, providing improved lattice matching for epitaxial growth, providing specific electronic properties, thermal conduction, and the like. Non-limiting examples of suitable material for the intermediate layer can include aluminum nitride, chromium nitride, silicon, silicon carbide, silicon nitride, tungsten carbide, gallium nitride, tungsten carbide, boron nitride, W, Mo, Ta, Cr, and composites or alloys thereof. In some embodiments, the intermediate material can comprise aluminum nitride, chromium nitride, silicon nitride, tungsten carbide, gallium nitride, and composites thereof. In yet another additional embodiment, the intermediate layer can comprise a material selected from the group consisting of aluminum nitride, chromium nitride, tungsten carbide, and composites thereof. Currently, the intermediate layer can be preferably aluminum nitride. Aluminum nitride can be beneficial since epitaxial growth of typical semiconductor materials, e.g., silicon and gallium based materials, thereon is facilitated with improved lattice matching.

Alternatively, an optional intermediate layer can comprise an electrically conductive material. Non-limiting examples of suitable conductive materials can include copper, aluminum, tungsten, tantalum, and alloys thereof. This optional intermediate layer can be included to provide a unique option of designing semiconductors having positive and negative electrodes on either side of the insulating layer.

Typically, the intermediate layer can have a thickness such that the contours and smoothness of the adynamic layer are substantially unaltered. However, some variation can occur, common thicknesses can range from about 50 nm to about 10 μm, and preferably about 400 nm to about 5 μm, depending on the specific application and device.

Figure 3A:
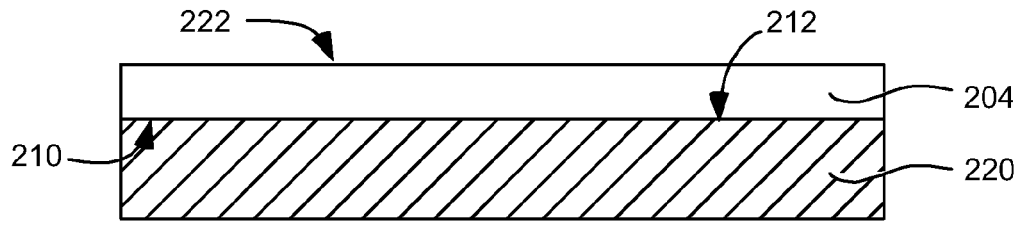
FIGS. 3A through 3D show side cross-sectional views illustrating one method of producing SOD devices in accordance with the present invention.

Referring now to FIGS. 3A through 3D, one method for making an SOD device in accordance with the present invention is shown. FIG. 3A illustrates a mold 220 having an interface surface 212 configured to inversely match a configuration intended for a device surface 210 of the SOI device. The mold used in the methods of the present invention can be of any material sufficient to withstand the vapor deposition and/or other layer formation processes, and allow the formation of a diamond film, or other intermediate layer thereon. Additionally, the mold can be designed to form a single or multiple SOD devices from which individual final SOD devices can be recovered. As a general overview of the following discussion, once the adynamic diamond layer is grown, the mold can be completely removed or only partially removed. The mold can comprise almost any suitable material, and in some cases can comprise a material suitable for use as the intermediate and/or semiconductor layers.

Although many materials can be used, the mold can comprise tungsten, silicon, titanium, chromium, zirconium, molybdenum, tantalum, manganese, carbides of these metals, ceramics, and composites or alloys thereof. However, in one aspect, the mold may be made of, or substantially made of, a metallic material. The metallic material may be a member selected from the group consisting of aluminum, copper, tungsten, molybdenum, tantalum, zirconium, vanadium, and chromium. In another embodiment, the mold may be made of, or made substantially of, non-metals, such as carbides and ceramics, including glass, oxide, and nitride materials. Examples of carbide materials include without limitation, tungsten carbide (WC), silicon carbide (SiC), titanium carbide (TiC), zirconium carbide (ZrC), and mixtures thereof among others. Examples of oxide materials include without limitation, quartz (i.e. crystalline $SiO_2$), corundum or sapphire (i.e. $Al_2O_3$), $LiTaO_3$, $LiNbO_3$, ZnO, and mixtures thereof. Examples of nitride materials include without limitation, silicon nitride ($Si_3N_4$), aluminum nitride (AlN), boron nitride (BN), titanium nitride (TN), zirconium nitride (ZrN), and mixtures thereof, among others. Examples of glass include all types of glass including soda glass, etc. Alternatively, the mold can comprise a material suitable for use as a semiconductor or intermediate layer as disclosed earlier.

The mold can be polished to form a very smooth interface surface 212. Polishing the mold interface surface may be accomplished using a variety of methods known to those skilled in the art; however, use of micron or nano-sized diamond particles during the polishing step can also provide a good nucleation enhancing layer for vapor deposition of diamond. The interface surface can be polished to a surface roughness corresponding to a desired surface roughness of the device surface 210. Certain non-metallic materials, such as the carbide and ceramic materials recited above are particularly well suited for use as a mold in the present invention because of their hardness and ability to achieve an extremely smooth interface surface. A smooth interface surface is particularly important when making a SOD device that requires a smooth device surface. In many cases, the interface surface of a ceramic material may be polished to have a surface roughness of less than about 10 μm. In other instances, the surface roughness can be less than about 5 μm. Depending on the device, a surface roughness of less than about 1 μm can provide good results. In some cases, an ultra smooth surface can be desirable and may be less than about 20 nm. As line width resolutions decrease, a surface roughness of less than 1 nm can also be beneficial in providing improved exposure resolutions and image acuities. Various methods for polishing the interface surface to achieve such a degree of smoothness, for example with diamond or nanodiamond powder or paste, or other diamond tools are well known to those skilled in the art.

Referring again to FIG. 3A, an adynamic diamond layer 204 can be grown on the mold 220 using a vapor deposition technique. Any number of known vapor deposition techniques can be used to form the adynamic diamond layer. The most common vapor deposition techniques include CVD and PVD, although any similar method can be used if similar properties and results are obtained. Currently, the preferred diamond growth method is CVD techniques such as hot filament, microwave plasma, oxyacetylene flame, and direct current arc techniques. The reactant gases used during such techniques may be any which are known in the art as useful for safely accomplishing diamond layer fabrication using a selected CVD technique. However, in one aspect, the gases used in the CVD technique are a combination of methane and hydrogen gases. The adynamic diamond layer can have a thickness as described above. However, in some cases a slightly thicker layer of diamond can be formed and then the growth surface can be carefully polished to the desired thickness.

An optional nucleation enhancing layer can be formed on the interface surface in order to improve the quality and deposition time of the diamond layer. Specifically, the diamond layer device surface can be formed by depositing applicable nuclei, such as diamond nuclei, on the interface surface of a mold and then growing the nuclei into a film or layer using a vapor deposition technique. While ceramics and other non-metal materials are able to achieve a smooth interface surface, many of these materials, such as oxides, are unable to nucleate diamond and retain it in place very well. Therefore, in order to overcome such a deficiency, in one aspect of the present invention, a thin nucleation enhancer layer can be coated upon the interface surface of the mold. Diamond nuclei are then placed upon the nucleation enhancer layer, and the growth of the diamond layer proceeds via CVD as described herein.

A variety of suitable materials will be recognized by those in skilled in the art which can serve as a nucleation enhancer. In one aspect of the present invention, the nucleation enhancer may be a material selected from the group consisting of metals, metal alloys, metal compounds, carbides, carbide formers, and mixtures thereof. Examples of carbide forming materials include without limitation, tungsten (W), tantalum (Ta), titanium (Ti), zirconium (Zr), chromium (Cr), molybdenum (Mo), silicon (Si), and manganese (Mn). Additionally, examples of carbides include tungsten carbide (WC), silicon carbide (SiC), titanium carbide (TiC), zirconium carbide (ZrC), and mixtures thereof among others.

The nucleation enhancer layer, when used, is a layer which is thin enough that it does not to adversely affect the transfer of the intended configuration from the interface surface to the device surface. In one aspect, the thickness of the nucleation enhancer layer may be less than about 0.1 micrometers. In another aspect, the thickness may be less than about 10 nanometers. In yet another aspect, the thickness of the nucleation enhancer layer is less than about 5 nanometers. In a further aspect of the invention, the thickness of the nucleation enhancer layer is less than about 3 nanometers.

As the nucleation surface of the diamond layer can be the device surface of the tool, care should be taken to ensure that this surface is of the highest quality and integrity possible. Different degrees of quality may be achieved during the vapor deposition process, as required by the particular device being fabricated. Those of ordinary skill in the art will readily recognized the differing conditions and techniques which produce a given degree of quality, and will be able to achieve various degrees of quality without undue experimentation.

Various methods may be employed to increase the quality of the diamond in the nucleation surface of the diamond layer which is created by vapor deposition techniques. For example, diamond particle quality can be increased by reducing the methane flow rate, and increasing the total gas pressure during the early phase of diamond deposition. Such measures, decrease the decomposition rate of carbon, and increase the concentration of hydrogen atoms. Thus a significantly higher percentage of the carbon will be deposited in a $sp^3$ bonding configuration, and the quality of the diamond nuclei formed is increased. Additionally, the nucleation rate of diamond particles deposited on the diamond interface surface of the mold or the nucleation enhancer layer may be increased in order to reduce the amount of interstitial space between diamond particles. Examples of ways to increase nucleation rates include, but are not limited to: applying a negative bias in an appropriate amount, often about 100 volts, to the diamond interface surface of the mold; polishing the diamond interface surface of the mold with a fine diamond paste or powder, which may partially remain on the interface surface; and controlling the composition of the diamond interface surface such as by ion implantation of C, Si, Cr, Mn, Ti, V, Zr, W, Mo, Ta, and the like by PVD or PECVD. Physical vapor deposition (PVD) processes are typically at lower temperatures than CVD processes and in some cases can be below about 200° C. such as about 150° C. Other methods of increasing diamond nucleation will be readily apparent to those skilled in the art.

Polishing with diamond powder or paste is especially useful when an ultra-smooth interface surface is desired. Further, when a fine diamond paste is used to polish the interface surface, many diamond particles may become embedded in the diamond interface surface, and can serve as seeds for increased nucleation rates. Certain metals, such as iron, nickel, cobalt, and their alloys, are known to catalyze diamond into amorphous carbon or graphite at high temperatures (i.e. greater than 700° C.). Thus, by limiting the amount of such substance in the composition of the interface surface of the mold, the amount of diamond which will be catalyzed to graphite is greatly reduced, and the overall quality of the nucleation surface is increased.

In one more detailed aspect of the present invention, the interface surface of the mold can be etched with micro-scratches to enhance nucleation. One method of introducing such micro-scratches is to immerse the mold in an acetone bath containing suspended micron-size diamond particles. Ultrasonic energy can then be applied to the mold and/or the fluid. Upon removal of the mold from the ultrasonic bath, a portion of the micron-sized diamonds remains on the surface as diamond growth seeds.

In another detailed aspect of the present invention, nucleation can be optionally enhanced by applying an electrical current such that a strong negative bias is created at the mold. An applied voltage of about 120 volts can increase nucleation density up to a million fold.

In one aspect, tungsten carbide may be used as the material for the mold, including the diamond interface surface thereof. However, by limiting the amount of cobalt binder contained therein to less than about 4% w/w, the incidence of diamond catalysis is greatly reduced. Further, it has been found that binder free tungsten carbide materials may be used to greatly reduce diamond catalysis. Additionally, it has been found that using ultra fine or sub-micron tungsten carbide grains creates a very smooth diamond interface surface which increases diamond nucleation. Additionally, the smooth micro-configuration of the interface surface is imparted to the device surface of the diamond layer.

Referring again to FIG. 3A, the device surface 210 can be produced at the interface surface 212 of the mold 220 as the diamond layer 204 grows. As the diamond layer grows, the growth surface becomes increasingly rough. Once the CVD process is complete, the growth surface 222 remains exposed and is typically rough compared to the device surface. As mentioned above, the adynamic diamond layer is not self-supporting such that if the mold were removed leaving only the diamond layer, the layer would curl or otherwise lose its intended shape, resulting in an unsuitable surface for use in a SOD device. Typically, the thickness of the adynamic diamond layer is less than about 30 μm such as between about 5 μm and about 20 μm, although other thicknesses may be suitable for particular applications.

Figure 3B:
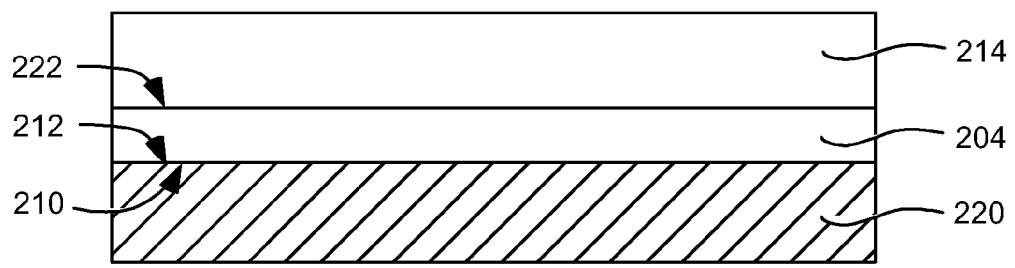

FIG. 3B illustrates one embodiment of the present invention. In order to prevent deformation of the adynamic layer, a substrate 214 can be joined to the growth surface 222 of the adynamic diamond layer 204 prior to removing the mold 220 or a portion thereof in order to prevent curling of the adynamic diamond layer. In one aspect of the present invention, the substrate can be joined to the growth surface of the adynamic diamond layer by brazing. A variety of brazing alloys may be suitable for use in the present invention. Of particular benefit are braze alloys which include a carbide former such as Ti, Cr, Si, Zr, Mn, and mixtures thereof. Several exemplary braze alloys include those of Ag—Cu—Ti, Ag—Cu—Sn—Ti, Ni—Cr—B—Si, Ni—Cu—Zr—Ti, Cu—Mn, and mixtures thereof. The brazing alloy may be supplied in any known form such as a powder or as a thin foil. Typical brazing temperatures are below about 1000° C. such as about 900° C.

Further, the substrate can preferably comprise a material having a thermal expansion which is comparable to that of diamond in order to prevent damage to the adynamic diamond layer upon cooling from the brazing temperatures. Brazing to the growth surface of the diamond layer has the added advantage in that the growth surface is rough, increasing the strength of the braze bond between the diamond layer and the substrate.

In some embodiments of the present invention, it may be desirable to use a non-carbide forming material for the mold. For example, when the mold is a non-carbide forming material such as copper, the diamond layer will separate from the mold upon cooling. Either before or after cooling a braze foil may be placed on the growth surface of the adynamic diamond layer. Subsequently, a substrate is placed against the braze foil and the assembly is pressed together under heat, and optionally vacuum, in order to braze the diamond layer to the substrate. In this embodiment, the mold is not attached to the diamond layer and may be easily removed.

Alternatively, the device surface of the adynamic diamond layer may be placed against a pressing surface which may be optionally coated with a layer of material which prevents bonding of the pressing surface to the diamond layer, such as an aerosol containing boron nitride. The braze foil may then be placed against the growth side of the adynamic diamond layer by carefully flattening the curved diamond layer followed by pressing the substrate against the braze foil and brazing the assembly as described above. Following joining the substrate, a portion of, or the entire mold can be removed without damaging the adynamic diamond layer. The device surface of the diamond may be polished to remove any residual graphitic bonds, but is often not required to achieve the necessary smooth finish. Any such polishing would be minimal and would be on the order of angstroms, occasionally on the order of nanometers, rather than microns.

Additionally, the substrate can be joined to the growth surface either before or after coupling the semiconductor layer. Typically, the substrate can be joined before coupling of the semiconductor layer as described above. However, as discussed herein, if the mold is used to form the intermediate layer or semiconductor layer, the substrate can be joined to the growth surface subsequent to formation of the semiconductor layer and or devices thereon. The particular choice of order of forming individual layers can depend on processing considerations such as convenience, strength of the layers, pre-existing equipment layout, and the like.

In one aspect, multiple layers of diamond may be deposited over one another using vapor deposition techniques while in the mold, or after the initial diamond layer has been formed and removed from the mold to form a consolidated layer of desired thickness. In one aspect, the diamond layer may be thickened after the deposition of the initial film, using non-vapor techniques, as are known in the art of diamond fabrication and consolidation. In another aspect of the invention, such thickening may take place while the initial diamond layer is still in the mold, or after it has been removed (e.g. by dissolution in acid or KOH).

Figure 3C:
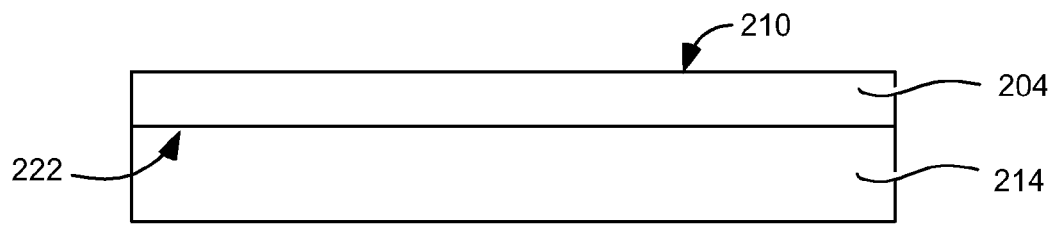

Depending on the specific embodiment the entire mold can be removed or only a portion thereof. FIG. 3C illustrates an embodiment wherein the entire mold is removed to expose the device surface 210 of the adynamic diamond layer 204. The mold and/or optional nucleation enhancer layer can be separated from the diamond layer using any mechanism suitable for removing the particular substance from which the mold and nucleation enhancer layer is fabricated. In one aspect of the present invention, the mold can be chemically removed from the diamond, such as by dissolution thereof with acid or a base solution such as KOH or by plasma etching. In another aspect, the mold can be physically removed from the diamond layer, for example by grit blasting or mechanical polishing. In yet another aspect, the mold can be removed from the diamond layer using a heat or cold treatment, such as a furnace for melting the mold, or liquid nitrogen for freezing and crumbling the mold. In a further aspect, separation of the mold from the diamond layer due to heating or cooling may be merely a result of different thermal expansion properties between the mold material and the diamond material.

Figure 3D:
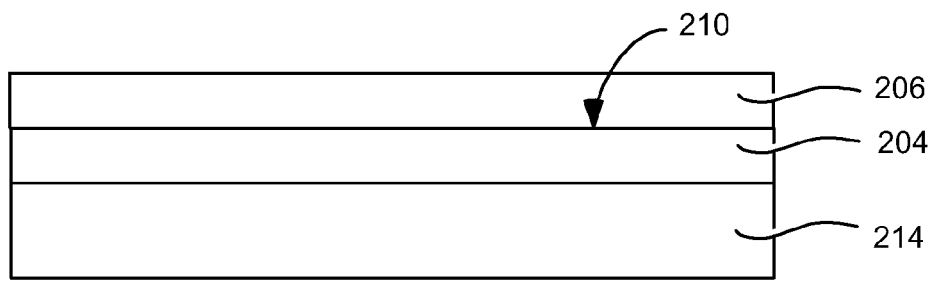

In accordance with the embodiment shown in FIG. 3D, a semiconductor layer 206 can be coupled to the device surface 210 of the adynamic diamond layer 204. The semiconductor layer can comprise any of the materials previously discussed or any other material suitable for construction of a particular device thereon. In another aspect of the invention, the semiconductor material can be obtained from a single crystal ingot in order to control the crystal orientation, reduce crystal defects, and provide a high electromechanical coupling factor. The single crystal ingot can be typically formed from a molten liquid rather than the vapor phase. Further, the single crystal ingot typically has a significantly lower defect content than crystals formed from using vapor deposition. Also, this eliminates concerns regarding epitaxial growth of the semiconductor layer on diamond-containing materials which can be difficult.

Further, additional components can be formed upon the exposed device surface of the diamond layer after removal of the mold, and nucleation enhancer layer if used. The types of devices which can be fabricated using the process of the present invention are any device for which an advantage may be found for incorporating diamond as an insulation layer. The SOD devices of the present invention can be incorporated into various electronic devices such as, but not limited to, logic chips, memory storage, light emitting diodes, e.g., blue LEDs, microwave generators, and other semiconductor devices. Those skilled in the art will recognize the potential advantages of SOD devices of the present invention and the methods by which such devices can be incorporated into various devices such as those mentioned above or other semiconductor devices. One significant advantage in many applications which require a very smooth device surface, is that because little or no device surface machining is necessary after removing the mold, the number of variations, microcracks or fissures which are caused by such machining is substantially reduced, or eliminated. The reduced incidence of variations, including micro cracks on the device surface greatly enhances the quality of the final product. Further, semiconductor devices and or features can be formed on the semiconductor layer either simultaneous with steps discussed herein or in separate steps according to known semiconductor fabrication techniques.

Alternatively, the mold can also serve as the substrate. In this case, the growth surface can most likely require polishing prior to coupling the semiconductor layer.

Figure 4A:
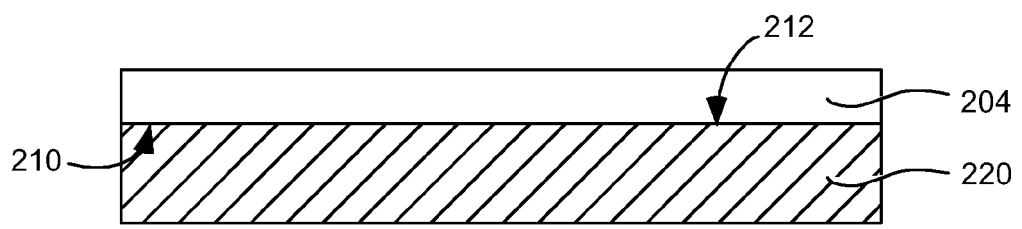
FIGS. 4A through 4C show side cross-sectional views illustrating an alternative method of producing SOD devices in accordance with the present invention.
Figure 4B:
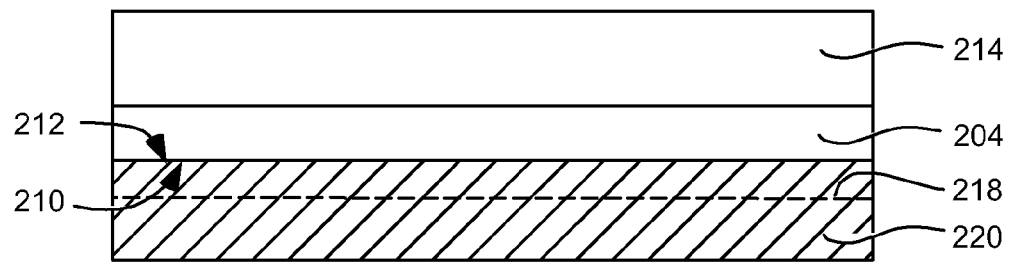
Figure 4C:
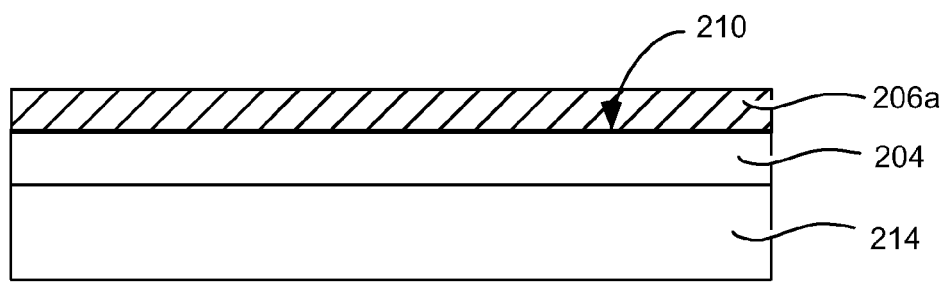

FIGS. 4A through 4C illustrate another alternative embodiment wherein at least a portion of the mold is left in place to form a layer of the SOD device. FIG. 4A illustrates an adynamic diamond layer 204 formed on the device surface 212 of a mold 220. A substrate 214 can be formed or attached as discussed previously. Alternatively, the substrate can be attached subsequent to removal of a portion of the mold.

As shown in FIG. 4B, the mold 220 can be thinned to a predetermined thickness shown by line 218. FIG. 4C illustrates the SOD device after removal of a portion of the mold. In such instances, the portion of the mold which remains becomes an integral part of the finished device. In order to produce a finished product under these circumstances, in some aspects, the outside surface of the mold may be polished or shaped to provide a desired configuration or thickness therefore, if such work has not been accomplished prior to the fabrication of the diamond layer. The mold can be thinned by grinding, polishing, or chemically etching to the desired thickness.

In one aspect, the thickness of the original mold may be any thickness or configuration required to produce a specific device. The predetermined thickness can be greater than about 1 millimeter and in some aspects can be greater than about 5 millimeters. In an additional aspect, the outside surface of the mold can be polished or shaped to have a configuration required to produce a specific device. In a further aspect, the mold may be polished or shaped into a layer have a thickness of less than about 1 micrometer. In another aspect, the thickness may be less than about 0.1 micrometer.

In one embodiment, the mold can comprise a material suitable for use as the semiconductor layer. In this case, the steps of growing the adynamic diamond layer and coupling a semiconductor layer are achieved simultaneously, i.e. the semiconductor layer is formed out of the mold. Examples of suitable mold materials which can also serve as the semiconductor layer include, but are not limited to, silicon, silicon carbide, gallium arsenide, gallium nitride, aluminum nitride, and composites thereof.

In an alternative embodiment, the intermediate layer can be provided by providing a mold of suitable material and then removing only portions of the mold necessary, as discussed above, before coupling the semiconductor layer thereto. Optionally, the intermediate layer can be formed after removal of the mold.

Additionally, the mold can be partially removed to expose at least a portion of the device surface. Typically, the substrate can be joined prior to removing a portion of the mold to aid in providing mechanical support. However, if only portions of the mold are removed, the remaining material of the mold can provide sufficient support in order to allow subsequent joining of the substrate later. This alternative can be desirable for processing convenience or other reasons such as forming multiple devices in a single process. The semiconductor layer can be coupled to the device surface by forming the semiconductor layer on at least the exposed portions of the device surface. Alternatively, an intermediate layer can be formed on the exposed portions of the device surface and then the semiconductor layer is then formed on the intermediate layer. In such embodiments, the semiconductor and/or intermediate layers can be formed by vapor deposition, brazing, gluing, or other known methods. In one preferred aspect, these layers can be formed by vapor deposition.

Some SOD devices utilize a layer of intermediate material. In one aspect of the present invention, a thin intermediate layer can be placed in contact with the smooth device surface of the diamond layer. In one embodiment of the present invention, an intermediate layer can be placed on the interface surface prior to growing the diamond layer thereon. In such embodiments, the intermediate layer can comprise a material which is suitable for nucleation and formation of diamond thereon. This can also be enhanced by forming a nucleation enhancing layer as discussed previously. By depositing a thin layer of material the smooth surface and contours of the mold interface is retained on the deposited intermediate layer. The mold, or a portion thereof, can be removed subsequent to the steps of growing the adynamic diamond layer and/or joining the substrate to the growth surface.

Alternatively, an intermediate layer can be attached to the device surface of the diamond layer after the mold is removed. Typically, the intermediate layer can be sputtered onto the device surface of the diamond layer or otherwise grown. Such methods of depositing material on a diamond surface from a vapor phase are well known to those skilled in the art such as CVD, PVD, or sputtering on a heated substrate. Subsequent heat treatments can be used to produce specific crystal and lattice structure suitable for a particular embodiment.

In an alternative embodiment of the present invention, it may be suitable to use a single crystal of substantial thickness. Typical single crystals are grown as ingots which are then cut for use in various devices. Additionally, in one aspect of the present invention, the single crystals can be optionally coated with a carbide former.

However, in accordance with one aspect of the present invention, these single crystal blanks can be bonded to the device surface of the diamond layer using an ultra thin layer of bonding material. Prior to bonding with the device surface, the single crystal should be polished to a smooth finish having a surface roughness which is comparable to the corresponding device surface. The surface roughness will depend on the intended final device. However, in some cases, a surface roughness of less than about one nanometer, preferably less than about 5 angstroms, can be suitable. Subsequently, an ultra thin layer of bonding material may be produced by forming a layer of bonding material on either the device surface or the smooth blank surface and then pressing the two surfaces together in order to reduce the bonding layer thickness to less than about 1 micron and preferably less than about 10 nanometers (i.e. only a few molecules thick). The bonding material may comprise an organic binder such as an epoxy or may be a reactive metal such as Ti, Si, Zr, Cr, Mo, W, Mn, or mixtures thereof. In the case of a reactive metal, the metal may be sputtered on a either the device surface or the smooth blank surface and then pressed against the other surface under heat and vacuum conditions. At these ultra thin thicknesses, the bonding material is more stable at higher temperatures. For example, typical epoxy binders will fail at temperatures above about 200° C.; however at ultra thin thicknesses the epoxy remains strong at higher temperatures. Further, SOD devices do not require the same degree of strength as in mechanical applications. Therefore, these thin layers of bonding materials are suitable for SOD devices. The bonded blank can then be ground and polished to any desired thickness, e.g. less than about 2 µm in the case of a SOD device.

Alternatively, the SOD devices of the present invention can be formed by providing a mold having an interface surface and growing an adynamic diamond layer on the interface surface using a vapor deposition technique. A semiconductor layer can be directly coupled to the growth surface of the adynamic diamond layer. The mold can be removed, thinned, or left in place for use as the substrate. Additionally, an intermediate layer can be formed on the growth surface. The semiconductor layer can then be formed on the intermediate layer. Optionally, the growth surface of the diamond layer can be polished prior to coupling the semiconductor layer thereto.

In order to mass produce the SOD devices of the present invention, the mold can be a wafer of sufficient size to produce multiple SOD devices from a single wafer precursor. Once the adynamic diamond layer is grown, the semiconductor layer formed, and the substrate is joined, the larger wafer precursor can be subdivided into individual SOD devices. Frequently, the thermal expansion coefficients of the diamond layer and the mold are sufficiently different to cause separation of the layers. This is typically not a problem over an area a few millimeters across, however economic mass production generally requires that such components be formed on wafers and then cut from the wafers. Additionally, wafer sizes are commonly up to 6 inches and newer processes utilize wafer sizes of 8 or 12 inches across. Thus, the difference in thermal expansion becomes a greater problem as the wafer size increases.

Therefore, in accordance with another aspect of the present invention, small grooves may be formed on the interface surface of the mold. The grooves form a grid wherein each subdivided area defines a surface corresponding to a single SOD device. The grooves may be formed by etching, cutting, or any other known method. As diamond, or intermediate material, is deposited thereon the grooves act to anchor the mold and isolate the thermal expansion differences to each grid area. Thus, as the mold cools subsequent to the vapor deposition process, the contraction of the mold is limited by the diamond deposited in the grooves. For example, a single crystal piezoelectric $LiNdO_3$ mold can have up to five times the thermal contraction of diamond when cooling from about 900° C. depending on the crystallographic orientation.

Although the grooves may be of any depth and width one current embodiment utilizes grooves having a width and a depth of about 1 µm to about 10 µm, and preferably about 5 µm. Any suitable method can be used to form such grooves, e.g., diamond scriber, chemical etching, etc. One advantage of using this method wherein the mold is only partially removed (and incorporated into the final device) is that the depth of the groove can be chosen to correspond to the desired thickness of the semiconductor layer or intermediate layer, although this is not required. For example, the mold would be made of a suitable semiconductor material and after joining a substrate to the growth surface of the adynamic layer, the mold can be polished until the diamond deposited in the grooves is exposed. In this embodiment, the remaining mold material is used in the final product.

Further, the degree of exposed diamond can be detected by a rise in electrical resistance (as diamond is electrically insulating) across the polishing surface. The electrical resistance can be measured across the entire wafer in order to maintain a substantially uniform thickness. Thus, for example, if the electrical resistance increases disproportionately on one side of the wafer, force can be increase to increase the polishing and removal rate at the opposite side of the wafer. As a guide, the uniform depth of the grooves helps to ensure a uniform thickness of semiconductor material across the entire wafer precursor. Other components can then be attached to the semiconductor material and final packaging materials can be layered thereon. The final devices can then be separated by cutting using known techniques to produce the final devices which may then be incorporated into various products. Although dimensions can vary, SOD device dimensions can typically have about 0.5 mm total thickness, wherein the semiconductor layer and diamond layer are up to about 30 µm.

In another variation of the above method which utilizes grooves in the ceramic mold, a CVD diamond-passive material is deposited in the grooves. Suitable CVD passive materials include any material on which diamond does not form under CVD conditions such as copper, silver, $SiO_2$, $Al_2O_3$, BN, graphite, and mixtures thereof. Copper is the currently preferred CVD diamond-passive material. During the CVD process diamond will form at the interface surface but not on the CVD passive material. Following the completion of the SOD devices thereon, the CVD passive material may be removed by acid dissolution or mechanical force. This variation of the present invention makes separating the individual devices from the wafer precursor much less expensive since no cutting of diamond is required. In yet another alternative a CVD passive material is deposited in a pattern which corresponds to individual SOD devices without forming grooves in the surface of the mold.

EXAMPLES

Example 1

A 100 mm diameter by 0.6 mm thick silicon wafer was polished to a surface roughness of less than 1 µm. The polished surface was then scratched using a diamond scriber along grid lines to form scratches about 2 µm deep. The silicon wafer was then placed in an ultrasonic bath containing acetone and dispersed micron-sized diamond fines. After treatment, the silicon wafer had a thin layer of micron-sized diamond particles remaining on the polished surface. The silicon wafer was then placed in a hot filament CVD system having an atmosphere of 1% methane and balance hydrogen at 40 torr. These conditions were maintained for about 30 hours, during which a diamond film was deposited to about 30 µm in thickness. The diamond coated silicon wafer was removed from the CVD system. A tungsten disk having a 100 mm diameter and 0.5 mm thickness was brazed to the growth side of the diamond using NICROBRAZ LM at 1005° C. for 12 minutes under a vacuum at $10^{-5}$ torr. The silicon substrate was then ground to about 1 µm thickness using diamond deposited in the scratches as a guide to maintain uniformity of grinding. The silicon on diamond wafer can then be further processed to form any number of semiconductor devices thereon.

Example 2

The same process was followed as in Example 1, except the tungsten disk is replaced by PVD sputtered tungsten.

Example 3

A 100 mm diameter by 0.6 mm thick silicon wafer was polished to a surface roughness of less than 1 µm. The silicon wafer was then placed in an ultrasonic bath containing acetone and dispersed micron-sized diamond fines. After treatment, the silicon wafer had a thin layer of micron-sized diamond particles remaining on the polished surface. The silicon wafer was then placed in a hot filament CVD system having an atmosphere of 1% methane and balance hydrogen at 40 torr. These conditions were maintained for about 30 hours, during which a diamond film was deposited to about 30 µm in thickness. The diamond coated silicon wafer was removed from the CVD system. A tungsten disk having a 100 mm diameter and 0.5 mm thickness was brazed to the growth side of the diamond using NICROBRAZ LM at 1005° C. for 12 minutes under a vacuum at $10^{-5}$ torr. The silicon substrate was then completely removed by dissolving in a hot concentrated sodium hydroxide solution. The exposed diamond surface was lightly polished and a 1 µm thick layer of aluminum nitride was deposited using PVD. The CVD process included an aluminum target in a nitrogen atmosphere under vacuum. The deposited aluminum nitride was found to align preferentially with the basal plane (0002), i.e. in parallel with a silicon surface. A semiconductor layer of gallium nitride was then deposited to form an SOD device. The SOD wafer can then be further processed to form any number of semiconductor devices thereon.

Example 4

The same process was followed as in Example 3, except a single crystal of silicon was deposited on the aluminum nitride intermediate layer in place of the gallium nitride layer.

Example 5

The same process was followed as in Example 1, except a gallium arsenide wafer was used instead of a silicon wafer. Further, a silicon wafer of the same dimensions was then brazed onto the CVD diamond. The gallium arsenide layer was then polished to a thickness of about 5 µm.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A semiconductor-on-diamond device, comprising:
   a) a mold;
   b) an adynamic diamond layer; and
   c) an intermediate layer disposed between the mold and the diamond layer.

2. The device of claim 1, wherein the mold comprises a semiconductor.

3. The device of claim 2, wherein the semiconductor comprises at least one member selected from the group consisting of, silicon, silicon carbide, gallium arsenide, gallium nitride, germanium, zinc sulfide, gallium phosphide, gallium antimonide, gallium indium arsenide phosphide, aluminum gallium arsenide, gallium nitride, boron nitride, aluminum nitride, indium arsenide, indium phosphide, indium antimonide, indium nitride, and mixtures and composites thereof.

4. The device of claim 2, wherein the semiconductor comprises an oxide material.

5. The device of claim 4, wherein the semiconductor comprises at least one member selected from the group consisting of aluminum oxide, zinc oxide and mixtures and composites thereof.

6. The device of claim 4 wherein the semiconductor comprises zinc oxide.

7. The device of claim 1, wherein the intermediate layer comprises at least one material selected from the group consisting of aluminum nitride, chromium nitride, silicon, silicon carbide, silicon nitride, tungsten carbide, gallium nitride, boron nitride, diamond-like carbon, tungsten, molybdenum, tantalum, chromium, and composites or alloys thereof.

8. The device of claim 1, wherein the intermediate layer comprises an electrically conductive material.

9. The device of claim 8, wherein the electrically conductive material comprises at least one member selected from the group consisting of copper, aluminum, tungsten, tantalum and alloys thereof.

10. A semiconductor-on-diamond device, comprising:
a) a mold;
b) a diamond layer having a thickness from about 10 nm to about 100 µm; and
c) an intermediate layer disposed between the mold and the diamond layer.

11. The device of claim 10, wherein the diamond layer comprises a diamond-containing material.

12. The device of claim 11, wherein the diamond-containing material comprises at least one member selected from the group consisting of natural diamond, synthetic diamond, polycrystalline diamond, diamond-like carbon, amorphous diamond.

13. The device of claim 12, wherein the diamond-containing material comprises synthetic diamond.

14. The device of claim 10, wherein the intermediate layer comprises a nucleation enhancing material.

15. The device of claim 14, wherein the nucleation enhancing material is selected from the group consisting of metals, metal alloys, metal compounds, carbides, carbide formers, and mixtures thereof.

16. The device of claim 15, wherein the carbide formers comprise at least one member selected from the group consisting of tungsten, tantalum, titanium, zirconium, chromium, molybdenum, silicon, and manganese.

17. The device of claim 15, wherein the carbides comprise at least one member selected from the group consisting of tungsten carbide (WC), silicon carbide (SiC), titanium carbide (TiC), zirconium carbide (ZrC), and mixtures thereof.

18. The device of claim 10, wherein the intermediate layer is electrically conductive.

19. A method of making a semi-conductor on diamond (SOD) device comprising the steps of:
providing a mold having an interface surface;
forming an intermediate layer on the interface surface of the mold;
growing a diamond layer on the intermediate layer.

20. The method of claim 19, wherein in growing the diamond layer is accomplished by using a vapor deposition technique.

21. A method of making a semiconductor-on-diamond (SOD) device comprising the steps of:
providing a mold having an interface surface, the mold comprising a semiconductor;
forming an intermediate layer on the interface surface of the mold;
growing a diamond layer on the intermediate layer using a vapor deposition technique; and
removing at least a portion of the mold.

22. A method of making a semiconductor-on-diamond (SOD) device comprising the steps of:
providing a mold having an interface surface configured to inversely match a configuration intended for a device service of the SOD device;
forming an intermediate layer on the interface surface of the mold;
growing a diamond layer on the intermediate layer using a vapor deposition technique; and
completely removing the mold thereby exposing a diamond device surface; and
forming a semi-conductor layer on the exposed diamond device surface.

* * * * *